(12) United States Patent
Yang et al.

(10) Patent No.: US 7,829,794 B2
(45) Date of Patent: Nov. 9, 2010

(54) PARTIALLY RIGID FLEXIBLE CIRCUITS AND METHOD OF MAKING SAME

(75) Inventors: Rui Yang, Austin, TX (US); Nathan P. Kreutter, Austin, TX (US); James S. McHattie, Austin, TX (US)

(73) Assignee: 3M Innovative Properties Company, St. Paul, MN (US)

( * ) Notice: Subject to any disclaimer, the term of this patent is extended or adjusted under 35 U.S.C. 154(b) by 138 days.

(21) Appl. No.: 11/855,038

(22) Filed: Sep. 13, 2007

(65) Prior Publication Data

US 2009/0071696 A1 Mar. 19, 2009

(51) Int. Cl.
*H05K 1/00* (2006.01)

(52) U.S. Cl. .................. 174/254; 174/258; 174/259; 361/749; 361/750; 361/751; 428/209; 428/458

(58) Field of Classification Search ............... 428/209, 428/901, 458; 174/255–258, 259, 254; 361/749, 361/750, 751
See application file for complete search history.

(56) References Cited

U.S. PATENT DOCUMENTS

| | | | |
|---|---|---|---|
| 3,271,214 A * | 9/1966 | Tabor ........................ 156/52 |
| 3,448,098 A | 6/1969 | Gaines et al. | |
| 3,469,982 A | 9/1969 | Celeste | |
| 3,526,504 A | 9/1970 | Celeste | |
| 3,867,153 A | 2/1975 | MacLachlan | |
| 4,543,295 A * | 9/1985 | St. Clair et al. ............. 428/458 |
| 4,847,353 A | 7/1989 | Watanabe | |
| 4,937,133 A | 6/1990 | Watanabe et al. | |
| 4,939,039 A | 7/1990 | Watanabe | |
| 5,091,251 A * | 2/1992 | Sakumoto et al. ........... 428/352 |
| 5,142,448 A | 8/1992 | Kober et al. | |
| 5,298,331 A * | 3/1994 | Kanakarajan et al. ....... 428/458 |
| 5,300,619 A * | 4/1994 | Okada et al. ................ 528/170 |
| 5,378,306 A | 1/1995 | Cibulsky et al. | |
| 5,428,190 A | 6/1995 | Stopperan | |
| 5,578,696 A * | 11/1996 | Mochizuki et al. .......... 528/353 |
| 6,316,734 B1 * | 11/2001 | Yang .......................... 174/256 |
| 6,611,046 B2 * | 8/2003 | Yang .......................... 257/622 |
| 7,348,045 B2 * | 3/2008 | Yang et al. ................. 428/1.26 |
| 7,364,666 B2 * | 4/2008 | Dasaratha et al. ............. 216/83 |
| 2001/0010303 A1 | 8/2001 | Caron et al. | |
| 2006/0007641 A1 | 1/2006 | Muenzberg | |

* cited by examiner

*Primary Examiner*—Cathy Lam
(74) *Attorney, Agent, or Firm*—Melanie G. Gover

(57) ABSTRACT

The present invention relates to partially rigid flexible circuits having both rigid portions and flexible portions and methods for making the same.

22 Claims, 1 Drawing Sheet

PARTIALLY RIGID FLEXIBLE CIRCUITS AND METHOD OF MAKING SAME

TECHNICAL FIELD

This invention relates to flexible circuits having rigid portions and to a method of making circuits having rigid and flexible sections.

BACKGROUND

Circuits and circuit boards having rigid and flexible portions, referred to herein as rigid flex circuits, are used in the electronics industry to mount and interconnect electronic components.

Currently, rigid flex circuits are generally made by one of three methods: (1) the rigid and flexible portions are fabricated separately then are glued together, (2) the flexible portion is fabricated then a rigid stiffener is glued to portions of the flexible circuit, or (3) a rigid multi-layer structure is made first then a laser is used to remove portions of the rigid structure to create a flexible region. All of these processes tend to be slow, costly, and result in poor feature alignment.

SUMMARY

An aspect of the present invention features a method of making a partially rigid flexible circuit comprising providing a rigid multi-layer structure having a first polymer layer, a first conductive layer over the first polymer layer, a first polyimide adhesive layer over the first conductive layer, and a second polymer layer over the first polyimide adhesive layer; and removing a portion of the second polymer layer and the first polyimide adhesive layer by chemical etching to form a flexible portion.

Another aspect of the present invention features an article comprising: a partially rigid flexible circuit having a first polymer layer, a patterned conductive circuit layer on the first polymer layer, a chemically-etchable polyimide adhesive layer on the patterned conductive layer, and a chemically-etchable second polymer layer on the chemically-etchable polyimide adhesive layer; wherein the chemically-etchable polyimide adhesive layer comprises a polyamide-imide having the following repeating units:

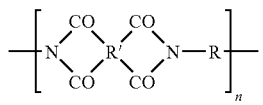

in which R represents a divalent radical, R' represents a trivalent radical, and n is an integer of at least 5; and wherein aligned portions of the first polymer layer and polyimide adhesive layer have been removed thereby forming a flexible portion.

As used in this invention:

"rigid portion" refers to a portion of the rigid flex circuit having at least one more layer than an adjacent flexible portion, is capable of supporting one or more devices attached to its surface, such as a surface mount component, and is sufficiently inflexible such that an attached device will not detach when a flexing or bending pressure is applied to the rigid portion; and "flexible portion" refers to a portion of the rigid flex circuit having at least one less layer than an adjacent rigid portion, is capable of bending at least 45 degrees and returning to its original shape.

An advantage of at least one embodiment of the present invention is the ability to remove large amounts of polymer quickly (e.g., taking seconds), precisely, and cleanly without the use of lasers, which are typically slow (e.g., taking hours), costly, and produce debris.

Another advantage of at least one embodiment of the present invention is the ability to produce many flexible regions without incurring an additional cost per each flexible region produced because multiple flexible portions may be formed at the same time when an etching process is used.

Another advantage of at least one embodiment of the present invention is the ability to register layers and align features of the rigid flex circuits very accurately.

Another advantage of at least one embodiment of the present invention is the reduction of process steps and process costs compared to existing methods of making rigid flex circuits.

Other features and advantages of the invention will be apparent from the following drawings, detailed description, and claims.

In the following detailed description, reference is made to the accompanying drawings, which form a part hereof, and in which is shown by way of illustration specific embodiments in which the invention may be practiced. The illustrated embodiments are not intended to be exhaustive of all embodiments according to the invention. It is to be understood that other embodiments may be utilized and structural or logical changes may be made without departing from the scope of the present invention. The following detailed description, therefore, is not to be taken in a limiting sense, and the scope of the present invention is defined by the appended claims.

DETAILED DESCRIPTION

Figure 1:
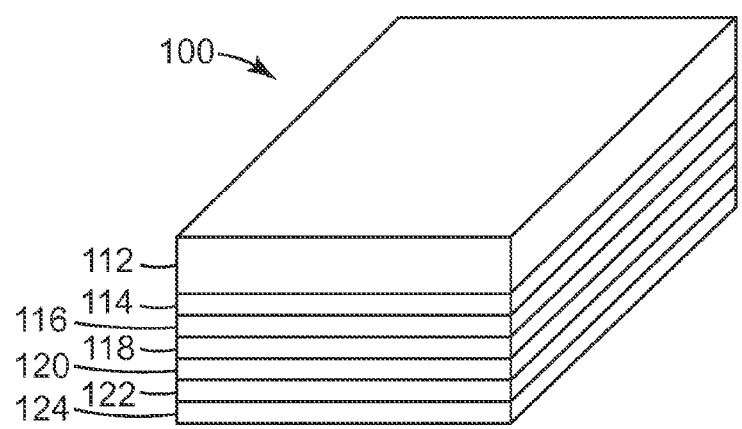
FIG. 1 depicts a prior art rigid multi-layer structure before the removal of any layers.
Figure 2:
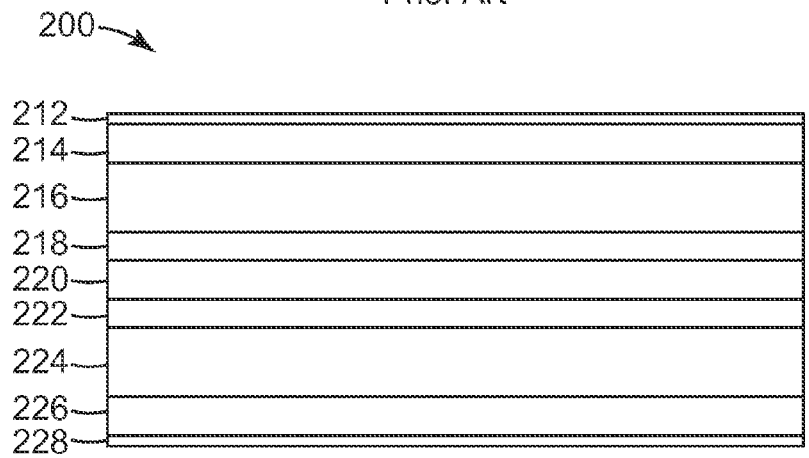
FIG. 2 depicts a second prior art rigid multi-layer structure before the removal of any layers.

Rigid multi-layer structures such as rigid circuits typically consist of single-layer or multi-layer sub-structures adhered to each other by adhesive layers. FIG. 1 shows an exemplary rigid multi-layer structure made by adhering a central conductive layer/polymer layer sub-structure 116/118 to a polymer layer 112 on one side and another conductive layer/polymer sub-structure 122/124 on the other side to form a multi-layer structure comprising polymer layers 112, 118, 124; adhesive layers 114, 120; and conductive layers 116, 122. FIG. 2 shows another exemplary rigid multi-layer structure made by adhering a central conductive layer/polyimide/conductive layer sub-structure 218/220/222 to conductive layer/polyimide sub-structure 212/214 and 228/226 on each side to form a structure comprising polymer layers 214, 224; adhesive layers 216, 224; and conductive layers 212, 218, 222, 228. These examples are not limiting. A rigid multi-layer structure may have any combination of sub-structures, and the substructures themselves may have many different combinations of materials. Typically, the rigid multi-layer structure will have at least a conductive layer/polymer layer substructure with a second polymer layer adhered to the conductive layer with an adhesive layer.

If a conductive layer in one of the sub-structures will form a circuit layer in the final product, it is typically desirable to pattern the circuit prior to adhering together the sub-structures. The conductive layer may be patterned by any suitable method, such as a standard photolithographic method. The conductive layer may consist of any suitable material such as copper (Cu), nickel (Ni), tin (Sn), silver (Ag), gold (Au), palladium (Pd), or platinum (Pt), and alloys thereof. The conductive layer may optionally have a tie layer, e.g., of nickel (Ni), chrome (Cr), nickel chrome (NiCr), other conductive metals, or alloys thereof, between the conductive layer and the polymer layer. In some embodiments, there may be an adhesive layer in place of the tie layer. If the conductive layer will become a trace layer, it most typically will be a copper layer.

To create flexible regions in the rigid multi-layer structure, portions of one or more of the sub-structures and the adhesive layers may be removed. In the current state of the art, the adhesive materials typically used between the sub-structures are not suitable for chemical etching. Typical adhesive materials include epoxy and acrylic adhesives. Additionally, although some non-adhesive thermoset polyimides have been known to be etchable by various etchant solutions, polyimide adhesives, which are thermoplastic polyimides, have not been well-suited for chemical etching because they are difficult and slow to etch, and therefore were not well-suited for use as etchable layers in rigid flex circuits. Accordingly, these adhesive layers acted as etch stop layers and only the sub-structures and layers on the outer side of an adhesive layers in a rigid multi-layer structure could be removed by chemically etching. This inability to chemically etch the adhesive layers significantly limited the usefulness of chemical etching methods in making rigid flex circuits by removing material from rigid multi-layer structures.

Through extensive and diligent research, the inventors found polyimide adhesives that can be chemically etched. Furthermore, the inventors found polyimide adhesives that can be etched with the same etchant solutions used for liquid crystal polymers (LCPs), polycarbonates, and thermoset polyimides, and in some cases at the same or a similar etch rate.

Particularly suitable polyimide adhesives include polyamide-imides having the following repeat units

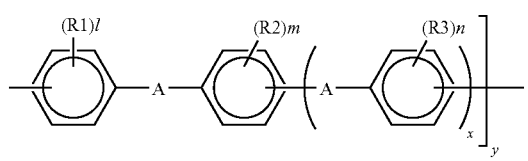

in which R represents a divalent radical, R' represents a trivalent radical, and n is an integer of at least 5.

In some embodiments, R is

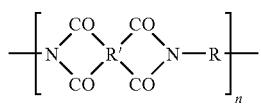

in which A is —NH—CO—, R1 to R3 are independently alkyl, alkoxy, or halogen, provided that at least one alkoxy group is present; l, m, and n are integers from 0 to 4; x is 0 or 1; and y is an integer indicating the number of repeating units.

In other embodiments R is

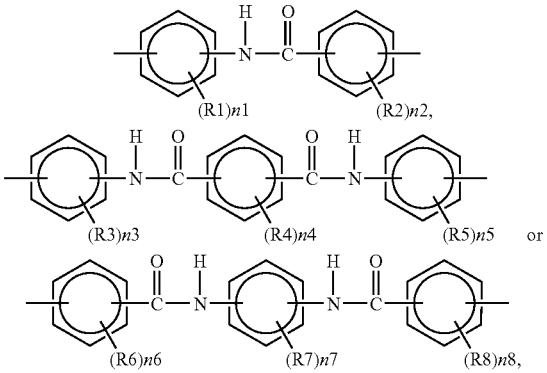

wherein R1 to R8 are independently lower alkyl groups, lower alkoxy groups, or halogens, and n1 to n8 are integers of 0 to 4.

In some embodiments R' is

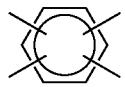

These adhesive polyamide-imides, and suitable variations thereof, are disclosed in U.S. Pat. Nos. 4,847,353; 4,937,133; and 4,939,039, which are incorporated by reference in their entirety. Suitable adhesive polyamide-imides are available under the trade designation ESPANEX from Nippon Steel Chemical Co., Ltd., Tokyo, Japan.

For the non-adhesive etchable polymer layers of the rigid flex circuit, examples of suitable materials include thermoset polyimides, polycarbonates, and liquid crystal polymers (LCP).

Thermoset polyimides have excellent properties such as thermal stability and low dielectric constant. Many commercially available thermoset polyimides suitable for use in the present invention comprise monomers of pyromellitic dianhydride (PMDA), or oxydianiline (ODA), or biphenyl dianhydride (BPDA), or phenylene diamine (PPD). Thermoset polyimide polymers including one or more of these monomers may be used to produce film products available under the trade designations KAPTON H, KAPTON K, and KAPTON E from E. I. du Pont de Nemours and Company, Circleville, Ohio and available under the trade designations APICAL AV and APICAL NP from Kaneka Corporation, Otsu, Japan. Films of these types are suitable for many flexible circuit products, but may swell in the presence of conventional chemical etchants, such as alkaline etchants. Swelling changes the thickness of the film and may cause localized delamination of resist. This can lead to loss of control of etched film thickness and irregular shaped features due to etchant migration into the delaminated areas. If swelling is an issue in the making of a particular flexible circuit, non-swelling materials should be used.

In contrast to the above-described thermoset polyimides, other thermoset polyimides suitable for use in the present invention are those having carboxylic ester structural units in the polymeric backbone. These thermoset polyimides will not swell in the presence of conventional chemical etchants. Examples of thermoset polyimides having carboxylic ester structural units in the polymeric backbone include those available under the trade designation APICAL HPNF from Kaneka Corporation, Otsu, Japan. APICAL HPNF polyimide film is believed to be a copolymer that derives its ester unit containing structure from polymerizing of monomers including p-phenylene bis(trimellitic acid monoester anhydride). Other ester unit-containing thermoset polyimide polymers may not be known commercially. However, to one of ordinary skill in the art, it would be reasonable to synthesize other ester-unit containing thermoset polyimide polymers depending upon selection of monomers similar to those used for APICAL HPNF. Such syntheses could expand the range of non-swelling thermoset polyimide polymers. Materials that may be selected to increase the number of ester-containing thermoset polyimide polymers include 1,3-diphenol bis(anhydro-trimellitate), 1,4-diphenol bis(anhydro-trimellitate), ethylene glycol bis(anhydro-trimellitate), biphenol bis(anhydro-trimellitate), oxy-diphenol bis(anhydro-trimellitate), bis(4-hydroxyphenyl sulfide) bis(anhydro-trimellitate), bis(4-hydroxybenzophenone) bis(anhydro-trimellitate), bis(4-hydroxyphenyl sulfone) bis(anhydro-trimellitate), bis (hydroxyphenoxybenzene), bis(anhydro-trimellitate), 1,3-diphenol bis(aminobenzoate), 1,4-diphenol bis (aminobenzoate), ethylene glycol bis(aminobenzoate), biphenol bis(aminobenzoate), oxy-diphenol bis(aminobenzoate), bis(4 aminobenzoate) bis(aminobenzoate), and the like.

Liquid crystal polymers (LCPs) have improved high frequency performance, lower dielectric loss, and less moisture absorption compared to polyimides. Liquid crystal polymers typically exhibit the same non-swelling property as some of the above-described thermoset polyimides. LCPs suitable for use in the present invention include those having aromatic polyesters including copolymers containing p-phenylene-terephthalamide, such as those available under the trade designation BIAC from Japan Gore-Tex Inc., Okayama-Ken, Japan; those having copolymers containing p-hydroxybenzoic acid, such as those available under the trade designation LCP CT from Kuraray Co., Ltd., Okayama, Japan; and LCP films such as those available under the trade designation R/FLEX from Rogers, Chandler, Ariz. A similarity between liquid crystal polymers and APICAL HPNF polyimide is the presence of carboxylic ester units in both types of polymer structures.

Polycarbonate characteristics include electrical insulation, moisture absorption less than 0.5% at saturation, a dielectric constant not to exceed 3.5 over the functional frequency range of 1 kHz to 45 GHz, better chemical resistance and lower modulus when compared to polyimide, and optical clarity. Examples of polycarbonates suitable for use in the present invention include substituted and unsubstituted polycarbonates, polycarbonate blends such as polycarbonate/aliphatic polyester blends, including the blends available under the trade designation XYLEX from GE Plastics, Pittsfield, Mass., polycarbonate/polyethyleneterephthalate(PC/PET) blends, polycarbonate/polybutyleneterephthalate (PC/PBT) blends, and polycarbonate/poly(ethylene 2,6-naphthalate) (PC/PEN) blends, and any other blend of polycarbonate with a thermoplastic resin; and polycarbonate copolymers such as polycarbonate/polyethyleneterephthalate (PC/PET), polycarbonate/polyetherimide (PC/PEI), and the like. Another type of material suitable for use in the present invention is a polycarbonate laminate. Such a laminate may have at least two different polycarbonate layers adjacent to each other or may have at least one polycarbonate layer adjacent to a thermoplastic material layer (e.g., LEXAN GS125DL which is a polycarbonate/polyvinyl fluoride laminate from GE Plastics). Polycarbonate materials may also be filled with carbon black, silica, alumina and the like or they may contain additives such as flame retardants, UV stabilizers, pigment and the like.

In addition to etchable polymer layers, it may be desirable to have polymer layers that will not be etched by the chemical etchants being used to remove portions of the rigid multi-layer structure (referred to hereafter as "etch-resistant" materials). For example, it may be desirable to use etch-resistant materials for polymer layer 124 in FIGS. 1 and 3 because it will form part of the flexible circuit portion of the rigid flex circuit. Suitable etch-resistant polymers include epoxy-containing and acrylate-containing polymers such as modified acrylate polymers available under the trade designation R/FLEX 1500 from Rogers Corporation, Rogers, Conn.; and heat-sealable polyimide polymers available under the trade designation KAPTON KJ from DuPont.

An exemplary process for making a rigid flex circuit according to the present invention may include etching certain polymer and polyimide adhesive layers. The conductive layer(s) may also be etched. Etching of the non-conductive layers involves contacting unmasked areas of the etchable polymer and polyimide adhesive layers with a concentrated aqueous alkaline etchant solution comprising a water soluble alkali metal salt, an amine, and an alcohol.

Water soluble alkali metal salts suitable for use in etchant solutions according to the present invention include, for example, alkali metal hydroxides such as potassium hydroxide (KOH), sodium hydroxide (NaOH), substituted ammonium hydroxides, such as tetramethylammonium hydroxide and ammonium hydroxide or mixtures thereof. Useful concentrations of the salts in the etchant solution vary depending upon the thickness of the polymer film to be etched, as well as the type, e.g., metal or photoresist, and thickness of the mask. Typical useful concentrations of a suitable alkali metal salt have a lower range of about 30 wt % in at least one embodiment and about 35 wt % in at least another embodiment. Typical useful concentrations of a suitable alkali metal salt have an upper range of about 50 wt % in at least one embodiment, and about 55 wt % in at least another embodiment. At least one embodiment has an alkali metal salt concentration of about 40 wt % to about 45 wt %.

Amines suitable for use in etchant solutions according to the present invention include ethylene diamine and propylene diamine, and alkanolamines such as ethanolamine, monoethanolamine (MEA), diethanolamine, propanolamine, and the like. Typical useful concentrations of a suitable amine have a lower range of about 10 wt % in at least one embodiment and about 15 wt % in at least another embodiment. Typical useful concentrations of a suitable amine have an upper range of about to 30 wt % in at least one embodiment, and about 35 wt % in at least another embodiment. At least one embodiment has an amine concentration of about 20 wt % to about 25 wt %.

Alkali metal salt/amine etchants, such as KOH/MEA etchants, have limited solubility in water at low temperatures, e.g., room temperature. At concentrations suitable for etching the etchable polymer and adhesive layers of the present invention, a KOH/MEA solution will typically solidify due to KOH crystallization. To prevent solidification, the solution can be maintained at elevated temperatures, e.g., 80° C. and above. However, it was found that elevated temperatures quickly degraded the etching ability of the solution. This is believed to be due to the absorption of carbonate from the air, which bonds with the potassium to form potassium carbonate. The inventors found that adding an alcohol, such as ethylene glycol, to the solution helped to reduce carbonate absorption and prevent KOH crystallization. Accordingly, an alcohol, such as a glycol, preferably ethylene glycol, or a ketone, such as methylethyl ketone (MEK), methyl isobutyl ketone (MIBK), is also typically added to the etchant solution to increase its stability and performance. Typical useful concentrations of a suitable alcohol have a lower range of about 3 wt % in at least one embodiment and about 5 wt % in at least one other embodiment and an upper range of about to 10 wt % in at least one embodiment and about 30 wt % in at least one other embodiment. In at least one embodiment, a suitable concentration is about 7 wt %.

In at least one embodiment, a suitable aqueous etchant solution comprises about 30 to about 50 wt % alkali metal salt, about 10 to about 30 wt % amine, and about 5 to about 10 wt % alcohol. In another embodiment a suitable aqueous etchant solution comprises about 40 wt % alkali metal salt, about 20 wt % amine, and about 7 wt % alcohol. In some embodiment, the alkali metal salt is KOH, the amine is MEA, and the alcohol is ethylene glycol.

The etchant solution is typically maintained at a temperature of about 50° C. to about 120° C. preferably about 70° C. to about 95° C. during etching. Typical etching time requirements for etching a polymer or adhesive layer with the alkaline etchant solution can range from about 10 seconds to about 20 minutes, depending on the type and thickness of the layer.

Any type of aqueous photoresist is suitable for use in the present invention. The resists may be positive or negative. Examples of suitable negative photoresists include negative acting, aqueous developable, photopolymer compositions such as those disclosed in U.S. Pat. Nos. 3,469,982; 3,448,098; 3,867,153; and 3,526,504. Such photoresists include at least a polymer matrix including crosslinkable monomers and a photoinitiator. Polymers typically used in photoresists include copolymers of methyl methacrylate, ethyl acrylate and acrylic acid, copolymers of styrene and maleic anhydride isobutyl ester and the like. Crosslinkable monomers may be multiacrylates such as trimethylol propane triacrylate.

Commercially available aqueous base, e.g., sodium carbonate developable, negative acting dry film photoresists include those commercially available under the trade designations KG 2150 and ACCUIMAGE from Kolon Industries, Korea. Also suitable are polymethyl-methacrylates photoresists such as those available under the trade designation RISTON, e.g., RISTON 4720, from duPont. Other useful examples include AP850 available from LeaRonal, Inc., Freeport, N.Y., and PHOTEC HU350 available from Hitachi Chemical Co. Ltd. Dry film photoresist compositions are available under the trade designation AQUA MER from MacDermid, Waterbury, Conn. There are several series of AQUA MER photoresists including the "SF" and "CF" series with SF120, SF125, and CF2.0 being representative of these materials. A metal mask may be used in the place of the photoresist.

The separate sub-structures of the rigid flex circuits are first fabricated individually. The specific process for fabricating each sub-structure will vary depending on the purpose and location of the sub-structure in the rigid flex circuit, the construction of the sub-structure, e.g., number and types of layers, and other factors. Standard fabrication techniques can be used to form the sub-structures.

Once the sub-structures have been fabricated, they are adhered together using etchable polyimide adhesive layers to form a rigid multi-layer structure, such as the structure shown in FIG. 1. To produce a rigid flex circuit such as shown in FIG. 3 from the rigid multi-layer structure shown in FIG. 1, the following process may be used.

Once the sub-structures are bonded together and the adhesives are adequately cured, e.g., by baking, a photomask such as a metal mask or an aqueous processable photoresist material is formed on one or both outer layers of the rigid multi-layer structure. If polymer layer 124 is etch-resistant, a photomask covering polymer layer 124 may not be needed. If an aqueous processable photoresist material is used, it may be applied to polymer layer 112 (and 124) using standard techniques. The thickness of the photoresist is typically about 5 µm to about 50 µm. Upon imagewise exposure of the photoresist to ultraviolet light or the like, through a mask, the exposed portions of the photoresist become insoluble due to crosslinking. The resist is then developed by removal of unexposed photoresist with a dilute aqueous solution, e.g., a 0.5-1.5% sodium carbonate solution, until the desired photoresist pattern is obtained on polymer layer 112. If photoresist is applied to polymer layer 124, it may be fully exposed to UV light to form a protective layer or may be pattern exposed if etched features are desired in polymer layer 124.

The process continues with exposure of the rigid multi-layer structure to a concentrated alkaline etchant solution, either by immersion in a bath or by spraying, typically at a temperature between 50° C. and 120° C. This etches the areas of polymer layer 112 and polyimide adhesive layer 114 not covered by crosslinked resist. The residence time in the etchant to etch through the polymer and polyimide adhesive layers down to conductive layer 116 is typically from about 10 seconds to about 20 minutes, depending on the composition and thickness of the layers. Conductive layer 116 acts as an etch stop because it is not etched by the alkaline etchant solution. The rigid multi-layer structure may subsequently be exposed to a metal-specific etchant, such as that available under the trade designation PERMA ETCH from Electrochemicals, Inc. when the conductive layer is copper, to remove the exposed portions of conductive layer 116, thereby exposing portions of the underlying polymer layer 118. The rigid multi-layer structure may then again be exposed to a concentrated alkaline etchant solution to etch away the exposed portions of polymer layer 118 and polyimide adhesive layer 120, leaving portions of patterned conductive circuit layer 122 and polymer layer 124 as the flexible portion 326 of the rigid flex circuit. A protective cover layer may subsequently be applied to the patterned conductive circuit. The crosslinked resist may then be stripped from the resulting rigid flex circuit using a dilute aqueous solution, containing from 2% to 5% alkali metal carbonate, at temperatures of about 20° C. to about 80° C., preferably about 20° C. to about 60° C.

Figure 3:
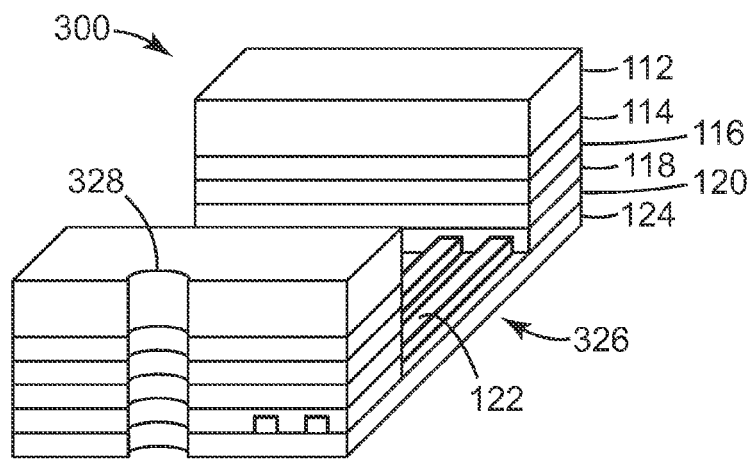
FIG. 3 depicts a rigid flex circuit after portions of the rigid multi-layer structure of FIG. 1 have been removed according to the present invention.

FIG. 3 also illustrates through hole 328, which extends from polymer layer 112 to polymer layer 124. It can be formed during the same etching steps as previously described.

In an alternate embodiment, additional layers may be added adjacent to polymer layer 124. These layers may be any combination of polyimide adhesive layers, polymer layers, and conductive layers. For example, in at least one embodiment, a conductive layer may be added directly adjacent polymer layer 124 to form a two-sided circuit. Some or all of these additional layers may be etched. They can be etched at the same time etching occurs for the same types of layers on the opposite side of the structure. For example, if both outer layers are similar polymer layers, they may be etched during the same etching step. By etching from both sides of the rigid structure, it is possible to form a partially rigid flexible circuit in which rigid portions are adjacent both the top and bottom surfaces of the flexible portion.

In forming the partially rigid flexible circuit, different areas of the rigid structure may be etched to different depths. For example, if the initial structure is an 8-layer structure, some areas of the finished product may have six layers etched away, while other areas have five, four, or fewer layers etched away.

The processes described above for making the rigid flex circuits may be conducted as a batch process, using individual steps, or in automated roll-to-roll fashion, using equipment designed to transport a web material through the process sequence from a supply roll to a wind-up roll. Automated processing uses a web handling device that has a variety of processing stations for applying, exposing and developing photoresist coatings, as well as etching and plating the metallic parts, and etching the polymer and adhesive films. Etching stations may include a number of spray bars with jet nozzles that spray etchant on the moving web to etch those parts of the web not protected by crosslinked photoresist. If a roll-to-roll process is used and the adhesive polyimide requires post-processing baking to cure, the inventors have found that the entire wound-up roll containing the rigid flex circuits may be placed in a bake oven. Alternatively, the web may be fed through an oven, but a long oven and/or a substantial dwell time for each section of the web would be required. Suitable adhesive curing conditions for at least one embodiment of the present invention is one hour at 185° C.

EXAMPLES

This invention is illustrated by the following example, but the particular materials and amounts thereof recited in these examples, as well as other conditions and details should not be construed to unduly limit this invention.

Example 1

A rigid multi-layer structure was prepared as follows: A 3 micrometer thick layer of copper was sputter deposited on a 1 mil thick layer of polyimide available under the trade designation KAPTON E from DuPont. A separate 3-layer structure was made by laminating a 25 micrometer layer of polyimide available under the trade name APICAL NP from Kaneka between two 12 micrometer copper layers. Sections of the copper/KAPTON E structure were adhered to each of the outer copper layers of the three layer structure, with the KAPTON E side facing the copper layer, using 35 micrometer layers of a polyimide adhesive available under the trade designation ESPANEX SPB-035A from Nippon Steel Chemical Company, Tokyo, Japan.

The 3 micrometer copper layer of the copper/KAPTON E structure was patterned to form a metal mask using standard photolithographic methods. The rigid multi-layer structure with the metal mask was sprayed with an aqueous etchant solution of 40 wt % KOH, 20 wt % ethanolamine, 7 wt % ethylene glycol, and 33 wt % water for a total of about 9 minutes at about 93° C. In a first etching step, the etchant etched through the 1 mil KAPTON E layer in about 4 minutes. The structure was then subjected to a hot water rinse to remove the dissolved polymer material. In a second etching step, the etchant etched through the 35 micrometer polyimide adhesive layer in about 5 minutes. The structure was again then subjected to a hot water rinse to remove the dissolved adhesive.

Example 2

A second example was made in the same manner as Example 1 except that the KAPTON E film had no sputter deposited copper layer and a photoresist mask was used instead of a metal mask during the etching step. The photoresist mask was patterned using standard photolithographic methods. In a single etching step, the etchant etched through the 1 mil KAPTON E layer and the 35 micrometer polyimide adhesive layer in about 12 minutes. The structure was then subjected to a hot water rinse to remove the dissolved polymer and adhesive material.

Various modifications and alterations of this invention will become apparent to those skilled in the art without departing from the scope and spirit of this invention and it should be understood that this invention is not to be unduly limited to the illustrative embodiments set forth herein.

What is claimed is:

1. A method of making a partially rigid flexible circuit comprising:
   providing a rigid multi-layer structure having a first polymer layer, a patterned conductive layer on the first polymer layer, a chemically-etchable polyimide adhesive layer on the patterned conductive layer, and a chemically-etchable second polymer layer on the chemically-etchable polyimide adhesive layer wherein the chemically-etchable polyimide adhesive layer comprises a polyamide-imide having the following repeating units:

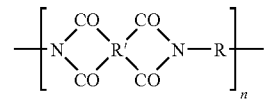

in which R represents a divalent radical, R' represents a trivalent radical, and n is an integer of at least 5; and
   removing a portion of the chemically-etchable second polymer layer and the chemically-etchable polyimide adhesive layer by chemical etching to expose at least a portion of the patterned conductive circuit layer and form a flexible portion in the rigid multi-layer structure.

2. The method of claim 1 wherein R is

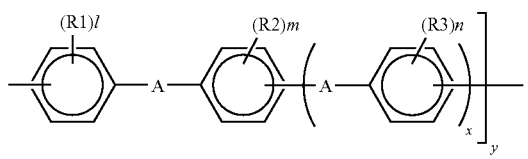

and A is —NH—CO—, R1 to R3 are independently alkyl, alkoxy, or halogen, provided that at least one alkoxy group is present; l, m, and n are integers from 0 to 4; x is 0 or 1; and y is an integer indicating the number of repeating units.

3. The method of claim 1 in which R is

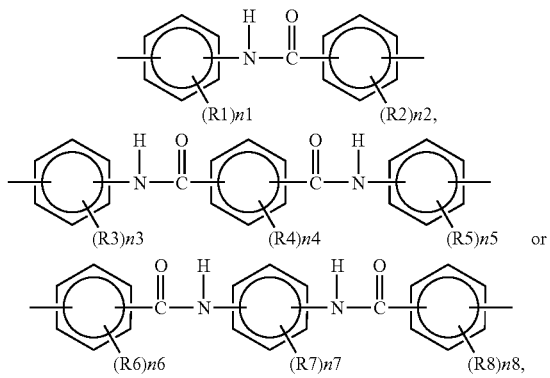

wherein R1 to R8 are independently lower alkyl groups, lower alkoxy groups, or halogens; and n1 to n8 are integers of 0 to 4.

4. The method of claim 1 in which R' is

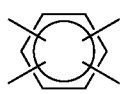

5. The method of claim 1 wherein the rigid multi-layer structure further comprises one or more additional layers selected from the group consisting of polyimide adhesive layers, chemically-etchable polymer layers, and conductive layers.

6. The method of claim 5 wherein one or more additional layers are adjacent to the first polymer layer.

7. The method of claim 6 wherein portions of one or more of the additional layers adjacent to the first polymer layer are removed by chemical etching.

8. A method of making a partially rigid flexible circuit comprising:

providing a rigid multi-layer structure having a first polymer layer, a patterned conductive layer on the first polymer layer, a chemically-etchable polyimide adhesive layer on the patterned conductive layer, and a chemically-etchable second polymer layer on the chemically-etchable polyimide adhesive layer wherein the chemically-etchable polyimide adhesive layer comprises a polyamide-imide having the following repeating units:

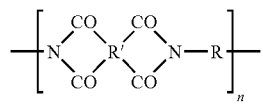

in which R represents a divalent radical, R' represents a trivalent radical, and n is an integer of at least 5; and removing a portion of the chemically-etchable second polymer layer and the chemically-etchable polyimide adhesive layer by chemical etching to form a flexible portion in the rigid multi-layer structure, wherein the second polymer layer comprises a polymer type selected from the group consisting of liquid crystal polymers, polycarbonates, and thermoset polyimides.

9. The method of claim 8 wherein R is

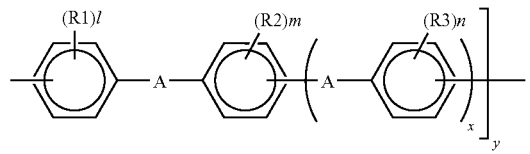

and A is —NH—CO—, R1 to R3 are independently alkyl, alkoxy, or halogen, provided that at least one alkoxy group is present; l, m, and n are integers from 0 to 4; x is 0 or 1; and y is an integer indicating the number of repeating units.

10. The method of claim 8 in which R is

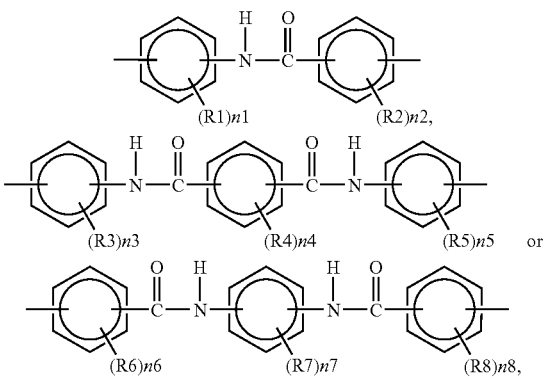

wherein R1 to R8 are independently lower alkyl groups, lower alkoxy groups, or halogens; and n1 to n8 are integers of 0 to 4.

11. The method of claim 8 in which R' is

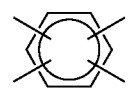

12. The method of claim 8 wherein the rigid multi-layer structure further comprises one or more additional layers selected from the group consisting of polyimide adhesive layers, chemically-etchable polymer layers, and conductive layers.

13. The method of claim 12 wherein one or more additional layers are adjacent to the first polymer layer.

14. The method of claim 13 wherein portions of one or more of the additional layers adjacent to the first polymer layer are removed by chemical etching.

15. An article comprising:

a rigid circuit having a first polymer layer, a patterned conductive circuit layer on the first polymer layer, a chemically-etchable polyimide adhesive layer on the patterned conductive layer, and a chemically-etchable second polymer layer on the chemically-etchable polyimide adhesive layer;

wherein the chemically-etchable polyimide adhesive layer comprises a polyamide-imide having the following repeating units:

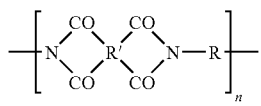

in which R represents a divalent radical, R' represents a trivalent radical, and n is an integer of at least 5; and wherein portions of the second polymer layer and polyimide adhesive layer have been removed by chemical etching thereby forming at least one flexible portion in the rigid circuit; and wherein at least a portion of the patterned conductive circuit layer is exposed in the flexible portion.

16. The article of claim 15 wherein R is

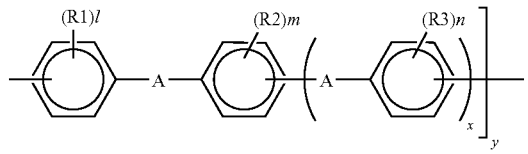

and A is —NH—CO—, R1 to R3 are independently alkyl, alkoxy, or halogen, provided that at least one alkoxy group is present; 1, m, and n are integers from 0 to 4; x is 0 or 1; and y is an integer indicating the number of repeating units.

17. The article of claim 15 in which R is

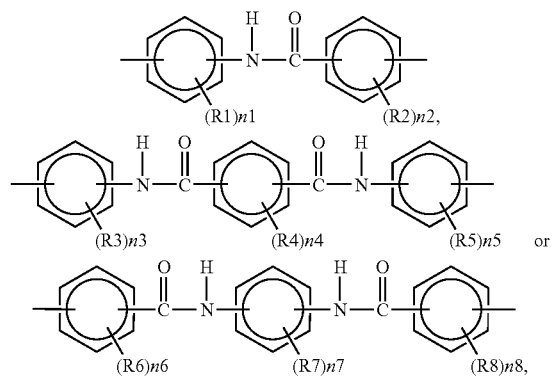

wherein R1 to R8 are independently lower alkyl groups, lower alkoxy groups, or halogens, and n1 to n8 are integers of 0 to 4.

18. The article of claim 15 in which R' is

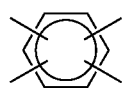

19. An article comprising:
a rigid circuit having a first polymer layer, a patterned conductive circuit layer on the first polymer layer, a chemically-etchable polyimide adhesive layer on the patterned conductive layer, and a chemically-etchable second polymer layer on the chemically-etchable polyimide adhesive layer;

wherein the chemically-etchable polyimide adhesive layer comprises a polyamide-imide having the following repeating units:

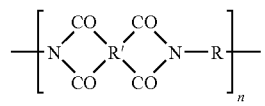

in which R represents a divalent radical, R' represents a trivalent radical, and n is an integer of at least 5; and wherein portions of the second polymer layer and polyimide adhesive layer have been removed by chemical etching thereby forming at least one flexible portion in the rigid circuit; and wherein the second polymer layer comprises a polymer type selected from the group consisting of liquid crystal polymers, polycarbonates, and thermoset polyimides.

20. The method of claim 19 wherein R is

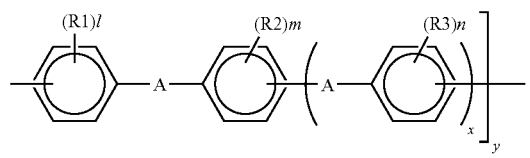

and A is —NH—CO—, R1 to R3 are independently alkyl, alkoxy, or halogen, provided that at least one alkoxy group is present; 1, m, and n are integers from 0 to 4; x is 0 or 1; and y is an integer indicating the number of repeating units.

21. The method of claim 19 in which R is

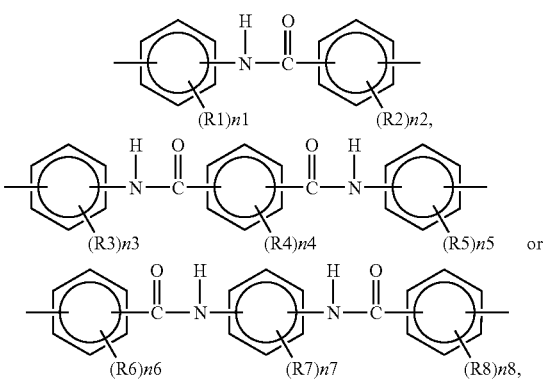

wherein R1 to R8 are independently lower alkyl groups, lower alkoxy groups, or halogens; and n1 to n8 are integers of 0 to 4.

22. The method of claim 19 in which R' is

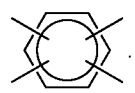

* * * * *

UNITED STATES PATENT AND TRADEMARK OFFICE
CERTIFICATE OF CORRECTION

PATENT NO.        : 7,829,794 B2                                    Page 1 of 1
APPLICATION NO.   : 11/855038
DATED             : November 9, 2010
INVENTOR(S)       : Rui Yang et al.

It is certified that error appears in the above-identified patent and that said Letters Patent is hereby corrected as shown below:

Column 4
Line 30, after "  " insert -- . --, therefore.

Column 12
Line 11, in claim 9, delete "R3are" and insert -- R3 are --, therefore.

Column 14
Line 21, in claim 20, delete "method" and insert -- article --, therefore.
Line 36, in claim 21, delete "method" and insert -- article --, therefore.
Line 58, in claim 22, delete "method" and insert -- article --, therefore.

Signed and Sealed this
Eighth Day of March, 2011

David J. Kappos
*Director of the United States Patent and Trademark Office*